(12) United States Patent
Goyal et al.

(10) Patent No.: US 8,748,349 B2
(45) Date of Patent: Jun. 10, 2014

(54) BUFFER LAYERS FOR REBCO FILMS FOR USE IN SUPERCONDUCTING DEVICES

(75) Inventors: Amit Goyal, Knoxville, TN (US); Sung-Hun Wee, Knoxville, TN (US)

(73) Assignees: UT-Battelle, LLC, Oak Ridge, TN (US); University of Tennessee Research Foundation, Knoxville, TN (US)

( * ) Notice: Subject to any disclaimer, the term of this patent is extended or adjusted under 35 U.S.C. 154(b) by 63 days.

(21) Appl. No.: 13/088,179

(22) Filed: Apr. 15, 2011

(65) Prior Publication Data
US 2012/0264612 A1 Oct. 18, 2012

(51) Int. Cl.
*H01B 12/00* (2006.01)
*H01L 39/24* (2006.01)
*H01L 39/12* (2006.01)

(52) U.S. Cl.
CPC .............. *H01L 39/24* (2013.01); *H01L 39/126* (2013.01)
USPC .......................................... 505/238; 505/237

(58) Field of Classification Search
CPC .............................. H01L 39/24; H01L 39/126
USPC ................................................. 505/237, 238
See application file for complete search history.

(56) References Cited

U.S. PATENT DOCUMENTS

| 5,096,882 | A |  | 3/1992 | Kato et al. |
|---|---|---|---|---|
| 5,164,363 | A |  | 11/1992 | Eguchi et al. |
| 5,266,558 | A |  | 11/1993 | Lichtenberg et al. |
| 5,432,151 | A |  | 7/1995 | Russo et al. |
| 5,508,255 | A | * | 4/1996 | Eddy .............................. 505/473 |
| 5,510,323 | A |  | 4/1996 | Kamo et al. |
| 5,543,630 | A |  | 8/1996 | Bliss et al. |
| 5,650,378 | A |  | 7/1997 | Iijima et al. |
| 5,739,086 | A |  | 4/1998 | Goyal et al. |
| 5,741,377 | A |  | 4/1998 | Goyal et al. |
| 5,801,105 | A |  | 9/1998 | Yano et al. |
| 5,846,912 | A |  | 12/1998 | Selvamanickam et al. |
| 5,872,080 | A |  | 2/1999 | Arendt et al. |
| 5,898,020 | A |  | 4/1999 | Goyal et al. |
| 5,958,599 | A |  | 9/1999 | Goyal et al. |
| 5,964,966 | A |  | 10/1999 | Goyal et al. |

(Continued)

FOREIGN PATENT DOCUMENTS

| DE | 19740964 | 3/1999 |
|---|---|---|
| EP | 0718897 | 6/1996 |

(Continued)

OTHER PUBLICATIONS

Brandle et al. "Preparation of perovskite oxides for high Tc superconductor substrates." J. Mater. Res, vol. 5, No. 10, Oct. 1990.*

(Continued)

*Primary Examiner* — Paul Wartalowicz
(74) *Attorney, Agent, or Firm* — Novak Druce Connolly Bove + Quigg LLP

(57) ABSTRACT

A superconducting article includes a substrate having a biaxially textured surface. A biaxially textured buffer layer, which can be a cap layer, is supported by the substrate. The buffer layer includes a double perovskite of the formula $A_2B'B''O_6$, where A is rare earth or alkaline earth metal and B' and B'' are different transition metal cations. A biaxially textured superconductor layer is deposited so as to be supported by the buffer layer. A method of making a superconducting article is also disclosed.

11 Claims, 10 Drawing Sheets

(56) References Cited

U.S. PATENT DOCUMENTS

| | | | |
|---|---|---|---|
| 5,968,877 A | 10/1999 | Budai et al. |
| 6,074,990 A | 6/2000 | Pique et al. |
| 6,077,344 A | 6/2000 | Shoup et al. |
| 6,106,615 A | 8/2000 | Goyal et al. |
| 6,114,287 A | 9/2000 | Lee et al. |
| 6,147,033 A | 11/2000 | Youm et al. |
| 6,150,034 A | 11/2000 | Paranthaman et al. |
| 6,151,610 A | 11/2000 | Senn et al. |
| 6,154,599 A | 11/2000 | Rey |
| 6,156,376 A | 12/2000 | Paranthaman et al. |
| 6,159,610 A | 12/2000 | Paranthaman et al. |
| 6,180,570 B1 | 1/2001 | Goyal |
| 6,190,752 B1 | 2/2001 | Do et al. |
| 6,214,772 B1 | 4/2001 | Iijima et al. |
| 6,231,779 B1 | 5/2001 | Chiang et al. |
| 6,235,402 B1 | 5/2001 | Shoup et al. |
| 6,261,704 B1 | 7/2001 | Paranthaman et al. |
| 6,265,353 B1 | 7/2001 | Kinder et al. |
| 6,270,908 B1 | 8/2001 | Williams et al. |
| 6,331,199 B1 | 12/2001 | Goyal et al. |
| 6,361,598 B1 | 3/2002 | Balachandran et al. |
| 6,375,768 B1 | 4/2002 | Goyal |
| 6,399,154 B1 | 6/2002 | Williams et al. |
| 6,440,211 B1 | 8/2002 | Beach et al. |
| 6,447,714 B1 | 9/2002 | Goyal et al. |
| 6,451,450 B1 | 9/2002 | Goyal et al. |
| 6,468,591 B1 | 10/2002 | Paranthaman et al. |
| 6,486,100 B1 | 11/2002 | Lee et al. |
| 6,537,689 B2 | 3/2003 | Schoop et al. |
| 6,555,256 B1 | 4/2003 | Christen et al. |
| 6,599,346 B2 | 7/2003 | Goyal et al. |
| 6,602,313 B2 | 8/2003 | Goyal et al. |
| 6,607,313 B1 | 8/2003 | Farries et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,632,539 B1 | 10/2003 | Iijima et al. |
| 6,635,097 B2 | 10/2003 | Goyal et al. |
| 6,645,313 B2 | 11/2003 | Goyal et al. |
| 6,657,229 B1 | 12/2003 | Eguchi et al. |
| 6,663,976 B2 | 12/2003 | Beach et al. |
| 6,670,308 B2 | 12/2003 | Goyal |
| 6,673,646 B2 | 1/2004 | Droopad |
| 6,716,795 B2 | 4/2004 | Norton et al. |
| 6,740,421 B1 | 5/2004 | Goyal |
| 6,756,139 B2 | 6/2004 | Jia et al. |
| 6,764,770 B2 | 7/2004 | Paranthaman et al. |
| 6,782,988 B2 | 8/2004 | Canacuzene et al. |
| 6,784,139 B1 | 8/2004 | Sankar et al. |
| 6,790,253 B2 | 9/2004 | Goyal et al. |
| 6,797,030 B2 | 9/2004 | Goyal et al. |
| 6,846,344 B2 | 1/2005 | Goyal et al. |
| 6,867,447 B2 | 3/2005 | Summerfelt |
| 6,872,988 B1 | 3/2005 | Goyal |
| 6,884,527 B2 | 4/2005 | Groves et al. |
| 6,890,369 B2 | 5/2005 | Goyal et al. |
| 6,899,928 B1 | 5/2005 | Groves et al. |
| 6,902,600 B2 | 6/2005 | Goval et al. |
| 6,921,741 B2 | 7/2005 | Arendt et al. |
| 6,956,012 B2 | 10/2005 | Paranthaman et al. |
| 6,984,857 B2 | 1/2006 | Udayakumar et al. |
| 7,087,113 B2 | 8/2006 | Goyal |
| 7,090,785 B2 | 8/2006 | Chiang et al. |
| 7,208,044 B2 | 4/2007 | Zurbuchen |
| 7,323,581 B1 | 1/2008 | Gardiner et al. |
| 7,338,907 B2 | 3/2008 | Li et al. |
| 7,341,978 B2 | 3/2008 | Gu et al. |
| 7,553,799 B2 | 6/2009 | Paranthaman et al. |
| 7,879,161 B2 | 2/2011 | Goyal |
| 2003/0185741 A1 | 10/2003 | Matyjaszewski et al. |
| 2004/0003768 A1 | 1/2004 | Goyal |
| 2004/0095658 A1 | 5/2004 | Buretea et al. |
| 2005/0013758 A1* | 1/2005 | James et al. ............. 423/263 |
| 2005/0239658 A1 | 10/2005 | Paranthaman et al. |
| 2006/0234066 A1 | 10/2006 | Zurbuchen |
| 2006/0276344 A1 | 12/2006 | Paranthaman et al. |
| 2007/0178227 A1 | 8/2007 | Hunt et al. |
| 2007/0238619 A1* | 10/2007 | Xiong ............................ 505/100 |
| 2008/0176749 A1 | 7/2008 | Goyal |
| 2009/0081456 A1 | 3/2009 | Goyal |
| 2009/0088325 A1 | 4/2009 | Goyal et al. |

FOREIGN PATENT DOCUMENTS

| | | |
|---|---|---|
| JP | 1065718 | 3/1987 |
| JP | 1100816 | 4/1989 |
| JP | 1100817 | 4/1989 |
| JP | 1220307 | 9/1989 |
| JP | 11025772 | 1/1999 |
| WO | 2008108606 | 9/2008 |

OTHER PUBLICATIONS

Koshy et al. "Novel ceramic substrates for high Tc superconductors." Bull. Mater. Sci., vol. 22, No. 3, May 1999, pp. 243-249.*

Koshy et al. "Rare-Earth Barium Stannates: Synthesis, Characterization, and Potential Use as Substrates for YBa2Cu3O7-d Superconductor." J. Am. Ceram. Soc., 78 [11] 3088-92 (1995).*

Ahn et al., "Heterogeneous Three-Dimensional Electronics by Use of Printed Semiconductor Nanomaterials," Science vol. 314, (2006) pp. 1754-1757.

Aytug et al., "Enhanced flux pinning in MOCVD-YBCO films through Zr additions: systematic feasibility studies," Superconductor Science and Technology, vol. 23, (2010), pp. 1-7.

Aytug et al., "Enhancement of Flux Pinning in $YBa_2Cu_3O_{7-\delta}$ Films via Nano-Scale Modifications of Substrate Surfaces," Oak Ridge National Laboratory, Oak Ridge, TN 37831, ISBN: 978-1-60021-692-3, pp. 237-262, 2007.

Aytug et al., "ORNL-Superpower CRADA: Development of MOCVD-based IBAD-2G wires" 2008, Retrieved from URL: http://111.htspeereview.com/2008/pdfs/presentations/wednesday/2G/5_2g_ornl_superpower.pdf [retrieved on Oct. 21, 2010].

Aytug, "Deposition studies and coordinated characterization of MOCVD YBCO films on IBAD-MgO templates," Superconductor Science and Technology, vol. 22, (2009) p. 1.

Chen et al., "Metal Organic Chemical Vapor Deposition for the Fabrication of YBCO Superconducting Tapes," SuperPower Inc., Schenectady, NY 12304, ISBN: 978-1-60021-6921, pp. 205-216, 2007.

Comini et al., "Quasi-one dimensional metal oxide semiconductors; Preparation, characterization and application as chemical sensors," Progress in Materials Science, vol. 54, No. 1 (2009) pp. 1-67.

Das et al., Novel nonlithographic quantum wire array fabrication: Physica E—Low-Dimensional Systems and Nanostructures, Elsevier Science BV, NL LNKD—DOI:10.1016/J.Physe.2005.10.015, vol. 36, No. 2, 3 (2007), pp. 133-139.

Duan et al., "Indium phosphide nanowires as building blocks for nanoscale electronic and optoelectronic devices," Optoelectronic Devices, Nature, vol. 409, (2001) pp. 66-69.

Gao, et al., Single and Binary Rare Earth $REBa_2Cu_3O_{7-\delta}$ Thin Films Prepared by Chemical Solution Deposition, J. Phys. Conf. Series, vol. 97, (2008) pp. 1-5.

Goyal et al., "Irradiation-free, columnar defects comprised of self-assembled nanodots and nanorods resulting in strongly enhanced flux-pinning in $YBa_2Cu_3O_{7-\delta}$ films," Superconductor Science and Technology, vol. 18, No. 11, (2005) pp. 1533-1538.

Goyal et al., "Self-assembled, ferromagnetic Co/YSZ nanocomposite films for ultrahigh density storage media," Abstract Submitted, 2009.

Han et al., "Transition Metal Oxide Core-Shell Nanowires: Generic Synthesis and Transport Studies," Nano Letters, vol. 4, No. 7, (2004) pp. 1241-1246.

Harrington et al., "Self-assembled, rare earth tantalite pyrochlore nanoparticles for superior flux pinning in $YBa_2Cu_3O_{7-\delta}$ films," Superconductor Science and Technology, Issue 2 (2009), pp. 1-5.

Haugan et al., "In-Situ Approach to Introduce Flux Pinning in YBCO," Air Force Research Laboratory, ISBN: 978-1-60021-692-3, pp. 59-77, 2007.

(56) References Cited

OTHER PUBLICATIONS

Hikichi et al., "Property and Structure of $YBa_2Cu_3O_{7-x}$-$Nb_2O_5$ Composite," Journal of Applied Physics, vol. 31, (1992) L1234, Col. 2 Paragraph 1.
Huang et al., "Room-Temperature Ultraviolet Nanowire Nanolasers," Science, vol. 292, (2001) pp. 1897-1899.
Javey et al., "Layer-by-Layer Assembly of Nanowires fore Three-Dimensional, Multifunctional Electronics," Nano Letters, vol. 7, No. 3 (2007) pp. 773-777.
Kang et al., "High-Performance High-$T_c$ Superconducting Wires," Science, DOI:10.1126/Science.1124872, vol. 331, No. 31 (2006), pp. 1911-SOM.
Kang et al., "Supporting material: High-performance H-$T_c$ Superconducting Wires," Science, vol. 331 (2006) 2 pp., col. 1, paragraph 3.
Kar et al., "Synthesis and Characterization of One-dimensional MgO Nanostructures," J. Nanosci. Nanotech, vol. 314, (2006) pp. 1447-1452.
Kita et al., "Effect of $Ta_2O_5$ addition on the superconducting properties of $REBa_2CU_3O_y$," Physica C: vol. 445-448, (2006) pp. 391-394.
Kuchibhatla et al., "One dimensional nanostructured materials," Progress in Materials Science, Pergamon Press, GB-LNKD DOI: 10.1016/J.Pmatsci.2006.08.001, vol. 52, No. 5 (2007) pp. 699-913.
Le et al., Systematic studies of the epitaxial growth of single-crystal ZnO nanorods on GaN using hydrothermal synthesis,: Journal of Crystal Growth, Elsevier, Amsterdam, NL LNKD—DOI:10.1016/J. Jcrysgro.2006.04.082, vol. 293, No. 1 (2006) pp. 36-42.
Lei et al., "Highly ordered nanostructures with tunable size, shape and properties: A new way to surface non-pattering using ultra-thin alumina masks," Progress in Materials Science, Pergamon Press, GB LNKD—DOI: 10.1016/J.Pmatsci.2006.07.002, vol. 52, No. 4 (2007) pp. 465-539.
Liang et al., "Preparation of Free-Standing Nanowire Arrays on Conductive Substrates," J. Am. Chem. Soc. vol. 126 (2004) pp. 16338-16339.
Lu et al., "Quasi-one-dimensional metal oxide materials-Synthesis, properties and applications," Materials Science and Engineering R: Reports, Elsevier Sequoia S.A., Lausanne, CH LNKD—DOI:10. 1016/J.Mser.2006.04.002, vol. 52, No. 103, (2006) pp. 49-91.
Ma et al., "Growth and properties of YBCO-coated conductors fabricated by inclined-substrate deposition," IEE Transactions on Applied Superconductivity, vol. 15, No. 2 (2005) pp. 2970-2973.
McIntyre et al., "Metalorganic deposition of high-$J_c$ $Ba_2YCu_3O_{7-x}$ thin films from trifluoroacetate precursors onto (100) $SrTiO_3$," Journal of Applied Physics, vol. 68, No. 8 (1990) pp. 4183-4187.
Morales et al. "A laser Ablation Method for the Synthesis of Crystalline Semiconductor Nanowires," Science, vol. 279 (1998) pp. 208-211.
Nagashima et al., "Epitaxial Growth of MgO Nanowires by Pulsed Laser Deposition," J. Appl. Phys., vol. 101 (2007) pp. 124304-1 to 124304-4.
Pan et al., "Nanobelts of Semiconducting Oxides," Science, vol. 291, (2001) pp. 1947-1949.
Paranthaman et al., "Flux Pinning and AC Loss in Second Generation High Temperature Superconductor Wires," Oak Ridge National Laboratory, Oak Ridge, TN 37832, ISBN: 978-160021-692-3, pp. 3-10, 2007.
Pomar et al., "Enhanced vortex pinning in YBCO coated conductors with BZO nanoparticles from chemical solution deposition," IEEE Transactions on Applied Superconductivity, vol. 19, No. 3, (2009) pp. 3258-3261.
Saylor et al., "Experimental Method for Determining surface Energy Anisotropy and its Application to Magnesia," Journal of the American Ceramic Society, vol. 83, No. 5, (2004) pp. 1226-1232.
Selvamanickam et al., "High-current Y—Ba—Cu—O coated conductor using metal organic chemical-vapor Deposition, and ion-beam-assisted deposition," IEEE Transactions on Applied Superconductivity, vol. 11, No. 1 (2001) pp. 3379-3381.

Su et al., "Fabrication of thin films of multi-oxides ($YBa_2Cu_3O_{7-\delta}$) starting from nanoparticles of mixed ions," Superconductor Science and Technology, vol. 19, No. 11, (2006) pp. L51-L54.
Wang et al., "Growth of Nanowires," Mater. Sci. & Eng., vol. 60, No. 1-6 (2008) pp. 1-51.
Wee et al., "Enhanced flux pinning and critical current density via incorporation of self-assembled rare-earth barium tantalite nanocolumns with $YBa_2Cu_3O_{7-\delta}$ films," Physical Review B., vol. 81, No. 14 (2010) pp. 140503/1-14053/2.
Wee et al., "Formation of Self-Assembled, Double Perovskite, $Ba_2YNbO_6$ Nanocolumns and Their Contribution to Flux-Pinning and $J_c$ In Nb-Doped $YBa_2Cu_3O_{7-\delta}$ Films," Applied Physics Express, vol. 3, Issue 2, (2010) pp. 023101-023101-3.
Wee et al., "High Performance Superconducting Wire in High Applied Magnetic Fields via Nanoscale Defect Engineering," Superconductor Science and Technology, (2008) pp. 1-4.
Yamada et al., Reel-to-Reel Pulsed Laser Deposition of YBCO Thick Films, Nagoya Coated Conductor Center, Superconductivity Research Laboratory, ISTEC, 2-4—1, Mutsuno, Atsuta-ku, Nagoya, 456,-8587-Japan, 2007.
Yamada et al., "Towards the practical PLD-IBAD coated conductor fabrication—Long wire, high production rate and $J_c$ enhancement in a magnetic field," Physica C: vol. 445-448 (2006) pp. 504-508.
Yoo et al., "Electrocatalytic application of a vertical Au nanorod array using ultrathin Pt/Ru/Pt layer-by-layer coatings," Electrochimica ACTA, vol. 53, No. 1-3 (2007) pp. 3656-3662.
Celik et al., "Nb-doped $SrTiO3$ buffer layers on $LaAIO3$ substrates by metalorganic deposition for YBCO superconducting films", Mat. Sci. Eng. B. (2004) 110: 96-102.
Chen et al., "Enhanced flux pinning by $BaZrO3$ and (Gd, Y)2O3 nanostructures in metal organic chemical vapor deposited GdYBCO high temperature superconductor tapes", Appl. Phys. Lett. (2009) 94: 062513.
Dimos et al., "Superconducting transport properties of grain boundaries in YBa2Cu3O7-8 bicrystals", Phys. Rev. B (1990) 41:4038-4049.
Goyal et al., "Conductors with controlled grain boundaries: An approach to the next generation, high temperature superconducting wire", J. of Materials Research (1997) 12: 2924-2940.
Hu et al., "MgO Nanowire Growth from Mg Metal and $SiO2$", Journal of Nanoscience and Nanotechnology (2004) 4(8): 1071-1075.
International Search Report and the Written Opinion of the ISA mailed on Dec. 27, 2012 in international Application No. PCT/US12/31835. (7 pages).
International Search Report and Written Opinion mailed on Jan. 12, 2010 in International Application No. PCT/US2010/044427.
Leonard et al., "Thickness dependence of microstructure and critical current density of Yba2Cu3O7—δ on-rolling assisted biaxially textured substrates", J. Mater, Res. (2011) 18(5): 1109-1122.
Matsumoto et al., "Surface-oxidation epitaxy method to control critical current of YBa2Cu3Oz-del coated conductors", Physica C: Superconductivity (2002) 378-381: 922-926.
Motowidlo et al., "Recent Progress in High-Temperature Superconductors at Intermagnetics General Corporation", Physica C., Superconductivity (2002) 335(1-4): 44-50.
Peng et al., "2D Monte Carlo Simulation of Proton Implantation of Superconducting YBa2Cu3O7—δ Thin Films Through High Aspect Ratio Nb Masks", Nuclear Instruments and Methods in Physics Research, Section B: Beam Interactions with Materials & Atoms (2000) 165: 44-50.
Shiohara et al., "Japanese Efforts on Coated Conductor Processing and its Power Applications: New 5 Year Project for Materials and Power Applications of Coated Conductors", (M-PACC) Physica C: Superconductivity (2009) 469(15-20): 863-867.
Van Der Laan, "YBa2Cu3O7—δ Coated Conductor Cabling for Low AC-Loss and High Field Magnet Applications", Superconductivity Science Technology (2009) 22(6).
Zhang et al., "Single Liquid Source Plasma-Enhanced Metalorganic Chemical Vapor Deposition of High Quality YBa2Cu3O7—δ Thin Films", Appl. Phys. Lett. (1992) 61(24): 2884-2886.

* cited by examiner

BUFFER LAYERS FOR REBCO FILMS FOR USE IN SUPERCONDUCTING DEVICES

STATEMENT REGARDING FEDERALLY SPONSORED RESEARCH OR DEVELOPMENT

This invention was made with government support under DE-AC05-000822725 awarded by the United States Department of Energy. The Government has certain rights in the invention.

FIELD OF THE INVENTION

This invention relates to superconducting materials and more particularly to buffer layers for superconducting articles.

BACKGROUND OF THE INVENTION

Successful fabrication of biaxially textured superconducting wire based on the coated conductor technology requires optimization of the cost/performance of the HTS conductor. From a superconducting performance standpoint, a long, flexible, single crystal-like wire is required. From a cost and fabrication standpoint, an industrially scalable, low cost process is required. Both of these critical requirements are met by Rolling-assisted-biaxially-textured-substrates (RABiTS).

In order for cost/performance for a conductor based on this technology to be optimized, further work needs to be done in the area of buffer layer technology. It is now clear that while it is fairly straightforward to fabricate long lengths of biaxially textured metals or alloys, it is quite difficult to deposit high quality buffer layers using low cost processes. Requirements of buffer layers include—it should provide an effective chemical barrier for diffusion of deleterious elements from the metal to the superconductor, provide a good structural transition to the superconductor, have a high degree of crystallinity, excellent epitaxy with the biaxially textured metal template, have good mechanical properties, high electrical and thermal conductivity and should be able to be deposited at high rates.

Buffer layers play a key role in high-temperature superconductor (HTS) materials, particularly in second-generation rare-earth-barium-copper-oxide (REBCO), especially yttrium-barium-copper-oxide (YBCO) wire technology. The purpose of the buffer layers is to provide a continuous, smooth and chemically inert surface for the growth of the YBCO film, while transferring the biaxial texture from the substrate to the YBCO. Buffer layers are important for preventing metal diffusion from the substrate into the superconductor, and as oxygen diffusion barriers. Nickel can poison the YBCO layer, destroying the superconductive properties. To transfer the texture from the template to the superconductor while preventing the diffusion of nickel metal to the YBCO film, buffer layers are needed. These insulating layers also reduce both alternating current losses and the thermal expansion mismatch between the crystal lattices of the substrate and the superconductor. Multi-layer architectures have been developed that also provide mechanical stability and good adhesion to the substrate.

It is important that the highly aligned buffer materials are matched in both the lattice constant and thermal expansion to the biaxially textured substrate and the YBCO layer. The buffer layers should be smooth, continuous, crack-free and dense. Even though the buffer layers are much thinner than the YBCO layer, buffer deposition cost is a substantial part of the total conductor cost. Hence, there is a need for the development of economically feasible, efficient, scalable, high rate, high quality buffer layers and associated deposition processes.

When growing an epitaxial oxide film on a metal surface it is essential to avoid oxide formation before the nucleation of the layer is complete. For example YBCO is typically grown in an atmosphere containing 100 ppm or more of oxygen at 700-800° C. Under such conditions Ni and W will form various native oxides on a NiW surface. Most of such oxide layers do not offer the bi-axial cubic texture required for high critical currents in the HTS layer. However, the ability of certain oxide films to be grown in very low oxygen partial pressures, i.e. below the oxidation of Ni and even W can be utilized. A thin seed layer is deposited first, to subsequently allow the growth of the full buffer and finally the YBCO processing at higher oxygen levels.

Although it is possible to grow oxide buffers directly on textured metal surfaces under suitable reducing conditions, oxygen penetrates through the buffer layers such as yttrium oxide, cerium oxide, and lanthanum zirconium oxide (LZO) to the metal oxide interface during the YBCO processing. This is mainly because the oxygen diffusivity of the buffer layer materials at 800° C. is in the range of $10^{-9}$ to $10^{-10}$ $cm^2/sec$. The diffusion is more rapid in structures that are more prone to the occurrence of defects. Grain boundaries, pinholes and particulates can also provide diffusion paths in these films. In most instances the oxidation of the metal substrate cannot be suppressed completely Thin homogeneous oxide layers are observed after final processing of the conductor without negative impact on the performance. Uncontrolled growth of substrate oxides, however, can result in multiple failures. Rapid and inhomogeneous oxide growth can penetrate the buffer layers and cause deterioration of the barrier properties of the buffer layer. For example, when excessive NiO is formed the full buffer layer stack can delaminate from the metal substrate due to volume expansion of, for example, Ni relative to NiO. The characteristics of the buffer layer can control the extent of oxide layer formation at the interface between the buffer and the substrate.

Buffer layers can be formed by multiple layers of materials which each serve a particular purpose. One example of a buffer layer stack of the prior art includes the use of YSZ and $CeO_2$, typically in a configuration of $CeO_2/YSZ/CeO_2$. The purpose of the first buffer layer is to provide a good epitaxial oxide layer on the reactive, biaxially textured Ni substrate without the formation of undesirable NiO. $CeO_2$ is particularly useful in this regard due to its ability to very readily form single orientation cube-on-cube epitaxy on cube textured Ni. Deposition of $CeO_2$ using a range of deposition techniques can be done using a background of forming gas (4% $H_2$-96% Ar) in the presence of small amounts of water vapor. Under such conditions the formation of NiO is thermodynamically unfavorable while the formation of $CeO_2$ is thermodynamically favorable. The water vapor provides the necessary oxygen to form stoichiometric $CeO_2$. Using $CeO_2$ as a buffer layer one can readily obtain a single orientation, sharp cube texture. Ideally, the $CeO_2$ layer would be grown thick such that it also provides a chemical diffusion barrier from Ni, followed by deposition of YBCO. However, when the $CeO_2$ layer is grown greater than 0.2 μm in thickness, it readily forms micro-cracks. Hence a YSZ layer which does provide an excellent chemical barrier to diffusion of Ni and does not crack when grown thick is deposited on a thin initial template of $CeO_2$. However, since there is a significant lattice mismatch between YSZ and YBCO, a second 45°-rotated orientation nucleates at times. In order to avoid the nucleation of this second orientation completely, a thin capping layer of CeO$_2$ or another material is deposited epitaxially on the YSZ layer.

The fabrication of YBCO coated conductors requires an economic and robust process to produce the YBCO superconductor layer. The BaF$_2$ ex situ (BF) method requires two distinct processing steps whereby first a non-superconducting precursor layer is deposited onto the substrate and this precursor layer is subsequently annealed in a furnace to form the superconducting YBCO. The two steps may facilitate economic scale-up for long length coated conductor fabrication. On a suitable substrate or buffer layer, using the BF method, the YBCO can be grown as an epitaxial layer with high critical current density ($J_c$).

Many buffer layer materials or substrates exhibit a deleterious chemical reactivity toward the precursor layer during the ex situ anneal to the extent that a high-$J_c$ epitaxial YBCO film cannot be obtained. For example CeO$_2$ exhibits a moderate reactivity toward the precursor layer (leading to the reaction product barium cerate, BaCeO$_3$). The reaction of the CeO$_2$ with YBCO always results in the formation of BaCeO$_3$ at the buffer/YBCO interface. The use of CeO$_2$ as a single buffer layer on metallic substrates is therefore restricted to metal (Ni) diffusion through the CeO$_2$ into the YBCO. LaMnO$_3$ (LMO) appears to exhibit a reduced reactivity toward the BF precursor during the ex situ anneal, making it easier to form epitaxial, high-$J_c$ YBCO layers. It has also been demonstrated that LMO provides a barrier against Ni diffusion and can be used as a single buffer layer. A single LMO layer was expected to replace both the YSZ and CeO$_2$ layers and possibly even the first seed layers.

LaMnO$_3$ perovskite (LMO) has been extensively studied in the past years. Recent work has demonstrated that LaMnO$_3$ and (La,Sr)MnO$_3$ perovskites are good buffer layers for growth of superconductors such as YBCO. This work suggests that LMO could be used as a single buffer layer on Ni and Ni—W substrates for growth of YBCO by either pulsed laser ablation or the ex-situ BF technique. It was also demonstrated that LMO could be grown epitaxially on MgO single crystal. This is important since it enables growth of such buffer layers on ion-beam assisted deposition (IBAD) or (ISD) produced, biaxially textured MgO on untextured metal substrates.

SUMMARY OF THE INVENTION

A superconducting article includes a substrate having a biaxially textured surface and a biaxially textured buffer layer supported by the substrate. The buffer layer includes a double perovskite of the formula A$_2$B'B"O$_6$, where A is rare earth or alkaline earth metal and B' and B" are different rare earth or transition metal cations. A biaxially textured superconductor layer is deposited so as to be supported on the buffer layer.

A can be at least one selected from the group consisting of Ba, Ca, and Sr. B' can be at least one selected from the group consisting of Y and RE. B" can be at least one selected from the group consisting of Nb and Ta. The double perovskite can be at least one selected from the group consisting of Ba$_2$(Y and/or RE)NbO$_6$ or Ba$_2$(Y and/or RE)TaO$_6$.

The superconducting layer can include a REBCO material. The REBCO can be YBCO. The biaxially textured substrate can be selected from the group consisting of single crystal substrates, RABiTS and IBAD substrates. The superconducting layer can be between 1-5 microns thick and the article can have a Jc greater than 1 MA/cm$^2$.

The buffer layer can be a diffusion barrier layer. The buffer layer can be provided between and in contact with the biaxially textured substrate and the superconducting layer.

The superconducting article can include another layer of a different material between the buffer layer and the biaxially textured substrate surface. The superconducting article can have another layer of a different material between the buffer layer and the superconductor layer.

A method of making a superconducting article includes the steps of providing a biaxially textured substrate; depositing a buffer layer comprising a double perovskite phase so as to be supported by the substrate, the buffer layer comprising a double perovskite of the formula A$_2$B'B"O$_6$, where A is rare earth or alkaline earth metal and B' and B" are different rare earth or transition metal cations; and growing a superconductor layer epitaxially so as to be supported by the buffer layer.

According to the method, A can be at least one selected from the group consisting of Ba, Ca, and Sr. B' can be at least one selected from the group consisting of Y and RE. B" can be at least one selected from the group consisting of Nb and Ta. The double perovskite buffer layer can be at least one selected from the group consisting of Ba$_2$(Y and/or RE)NbO$_6$ or Ba$_2$(Y and/or RE)TaO$_6$.

Another layer of a different material from the buffer layer can be epitaxially deposited between the buffer layer and the biaxially textured substrate surface. Another layer of a different material from the buffer layer can be epitaxially deposited between the buffer layer and superconductor.

The method can include an in-situ deposition process selected from the group consisting of pulsed laser ablation, MOCVD, sputtering or e-beam co-evaporation that is used to form the buffer layer of the double perovskite phase. The buffer layer can be formed using an ex-situ process such as chemical solution processes (MOD, TFA, non-fluorine processes, reduced fluorine processes) and the ex-situ BaF$_2$ process wherein a precursor film is first deposited, followed by a heat treatment to epitaxially form the film.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION OF THE INVENTION

Superconducting articles according to the invention include a double perovskite buffer layer, which can be a cap layer, a biaxially textured substrate and a biaxially textured superconducting layer. The term "cap layer" as used herein means that the double perovskite layer is in physical contact with the superconducting layer, and can be interposed directly between the substrate and the superconducting layer or there can be additional layers between the substrate and the double perovskite layer.

Double perovskites useful for the invention have the general formula $A_2B'B''O_6$, where A is rare earth (RE) or alkaline earth metal and B' and B'' are different RE or transition metal cations. A can be Ba, Ca, or Sr. B' can be Y, RE. B'' can be Nb or Ta.

The invention incorporates a buffer layer of the double perovskite phase, such as $Ba_2(Y$ and/or $RE)NbO_6$ or $Ba_2(Y$ and/or $RE)TaO_6$, for growing the superconducting film. Since this phase has a large lattice mismatch with REBCO or YBCO films, it is expected that the c-axis of YBCO phase will sharply tilt towards the substrate normal. When this happens, the full-width-half-maximum of the rocking curve or the omega scans both for rocking in the rolling direction and about the rolling direction, can sharpen considerably, which can result in a YBCO or REBCO layer with a FWHM of the out-of-plane texture of only a few degrees. This may in turn also make the FWHM of the in-plane texture sharper. This improvement in texture could result in massive enhancement in the critical current density of the films. Also, unlike the presently used cap buffer layers of $CeO_2$ and $LaMnO_3$, wherein reaction with YBCO or REBCO are observed, the double perovskite phase $Ba_2(Y$ and/or $RE)NbO_6$ or $Ba_2(Y$ and/or $RE)TaO_6$ have essentially no reaction with YBCO.

The double perovskite phase $Ba_2(Y$ and/or $RE)NbO_6$ or $Ba_2(Y$ and/or $RE)TaO_6$ cap layer may also serve as a diffusion barrier layer since it has low reactivity and may also have less diffusion of cation elements through it.

The $Ba_2(Y$ and/or $RE)NbO_6$ or $Ba_2(Y$ and/or $RE)TaO_6$ buffer layer could also serve as a seed layer in addition to serving as the diffusion and cap layer. The invention can thereby provide a single buffer layer.

The superconducting article can include another layer of a different material between the buffer layer and the biaxially textured substrate surface. The superconducting article can have another layer of a different material between the buffer layer and the superconductor layer.

Figure 1:
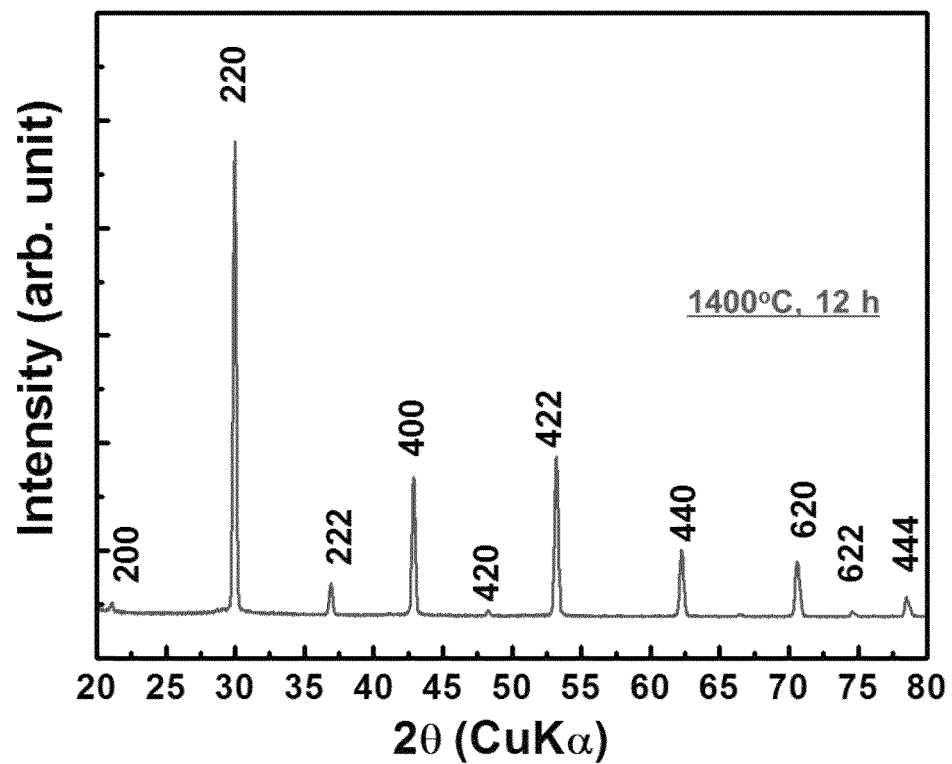
FIG. 1 is a θ-2θ scan for Ba$_2$YNbO$_6$ powder heat-treated at 1400° C., 12 h.

Epitaxial $Ba_2YNbO_6$ (BYNO) films were directly deposited on biaxially textured Ni—W substrates using pulsed laser ablation (PLD). Stochiometric BYNO powder was synthesized by using commercially available powders of $BaCO_3$, $Y_2O_3$ and $Nb_2O_5$ with high purities over 99.9% via solid state synthesis. X-ray diffraction results for the calcined powder indicates a single phase of BYNO without any trace of $2^{nd}$ phase (FIG. 1). The powder was pressed and sintered at 1450° C. for 12 h to prepare a BYNO target with 1" diameter. BYNO films were prepared on biaxially textured Ni-3 at. % W (50 μm) substrates via pulsed laser deposition (PLD) with a KrF laser (λ=248 nm) at a repetition rate of 10 Hz. Laser energy density and substrate to target distance were 1.6 J/cm² and 5 cm, respectively. Films were grown at a substrate temperature ($T_s$) in the range of 600-750° C. at a pressure of ~3×10⁻⁵ Torr.

Figure 2:
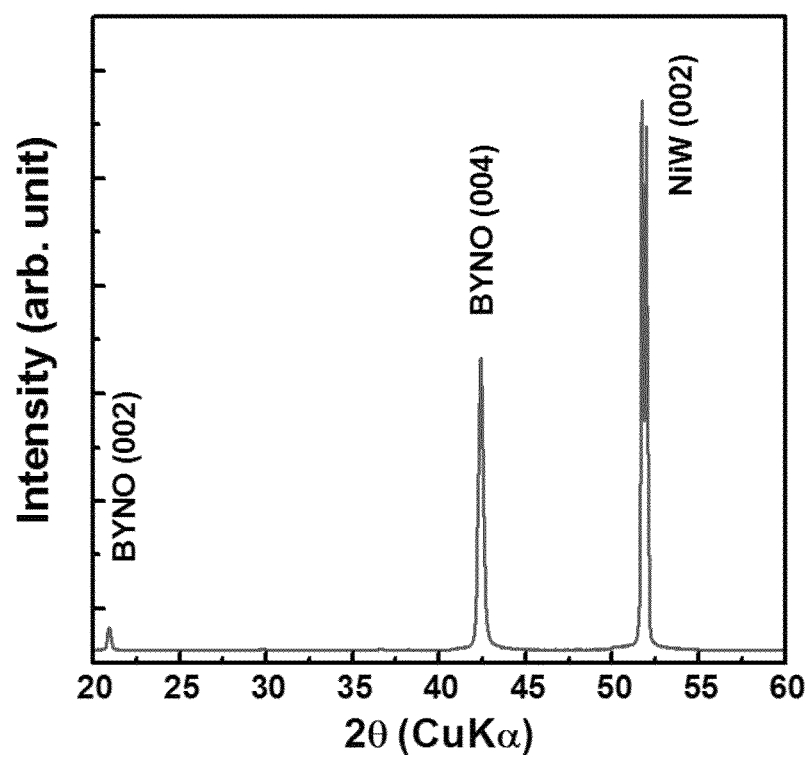
FIG. 2 is a θ-2θ scan for an epitaxial Ba$_2$YNbO$_6$ film grown on a bare Ni-3W substrate at 650° C. by PLD.
Figure 3:
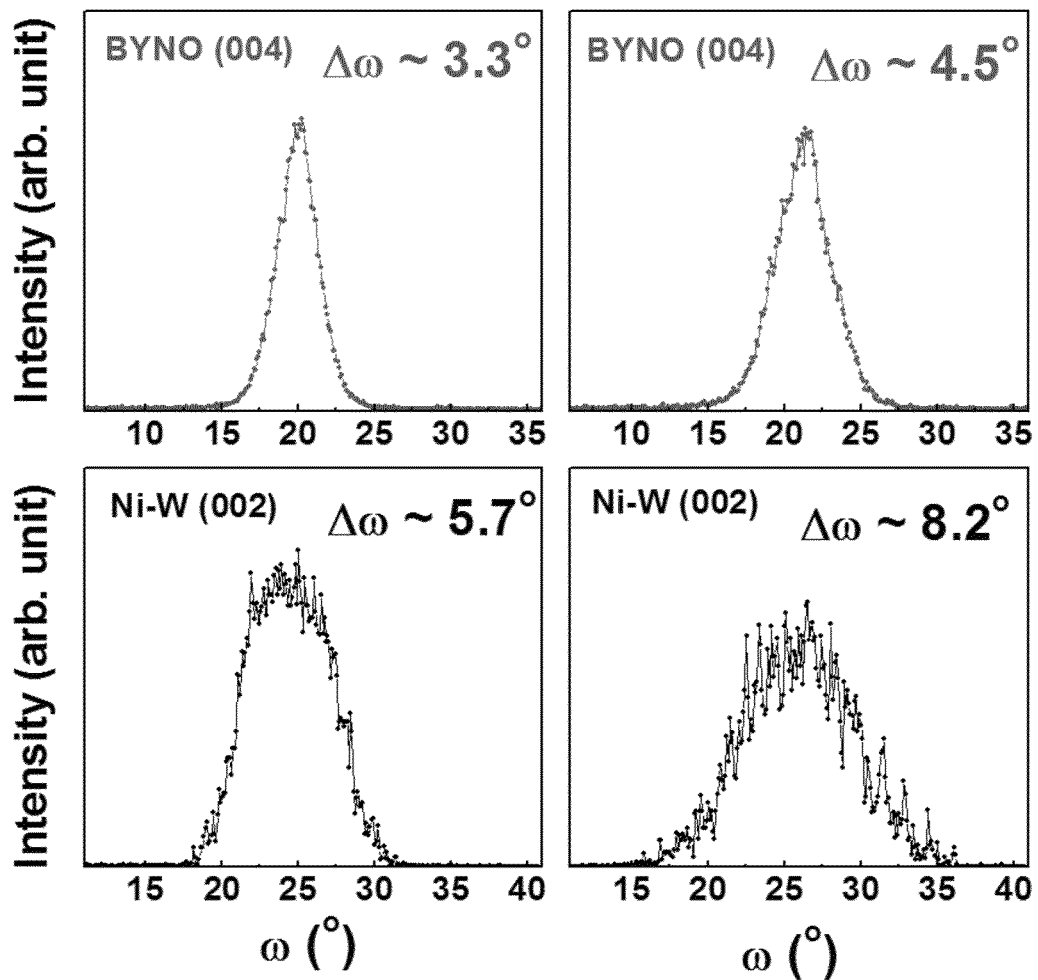
FIG. 3 is a plurality of ω scans for a BYNO layer and a NiW substrate for the BYNO film grown on Ni-3W substrate. The left figures are ω scans at rolling (φ=0°) direction and the right figures are ω scans at the transverse (φ=90°) direction.
Figure 4:
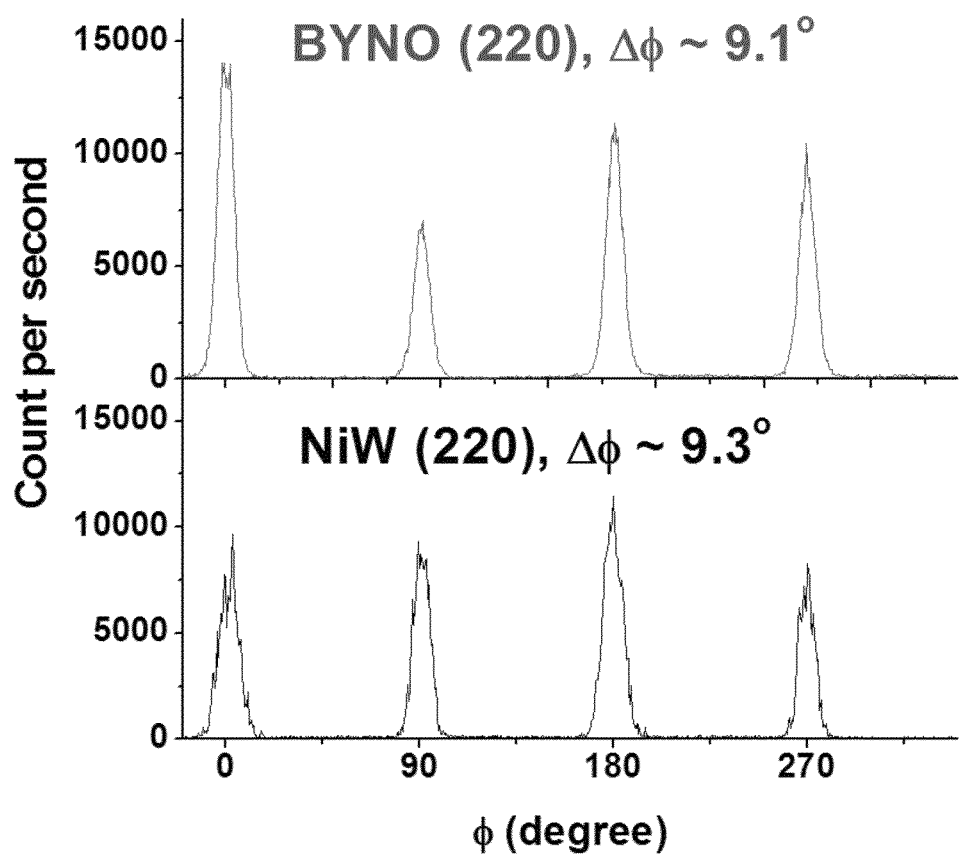
FIG. 4 is a plurality of (220) φ scans for a BYNO layer and a NiW substrate for the BYNO film grown on Ni-3W substrate.

FIGS. 1-4 show X-ray diffraction (XRD) results for an epitaxial BYNO film directly grown on Ni-3W substrate, indicating that the sample has excellent cube-on-cube epitaxy. The θ-2θ scan (FIG. 1) shows the film has 100% (00l) orientation without any additional peaks related to other oriented grains. FIGS. 2 and 3 show the omega and phi scans for the BYNO and NiW substrate. The BYNO film shows much smaller Δω values than those for the NiW substrate, indicating significant texture sharpening in out-of-plane, while their in-plane textures determined by Δφ values are similar. Such significant texture sharpening is attributed to a large lattice mismatch (~19.7%) between them, which leads to the tilted epitaxy of the BYNO layer on NiW.

Figure 5:
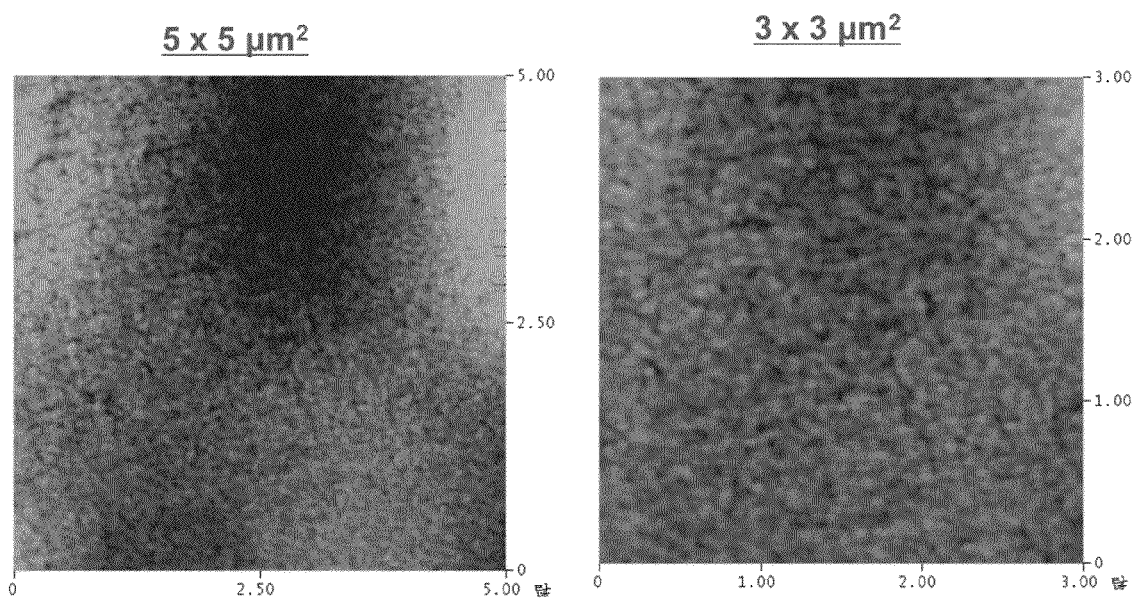
FIG. 5 is a pair of atomic force microscopy images for the BYNO film grown on the NiW substrate. Scan sizes are 5×5 μm$^2$ (left image) and 3×3 μm$^2$ (right image).

FIG. 5 shows atomic force microscopy images for the BYNO films. The film has very smooth surface morphology with rms roughness of 2.2 nm for 5×5 μm² scan and 1.4 nm for 3×3 μm² scan. Such a smooth surface is desirable for the subsequent epitaxial growth of either YBCO superconducting films or additional buffer layers.

Figure 6A:
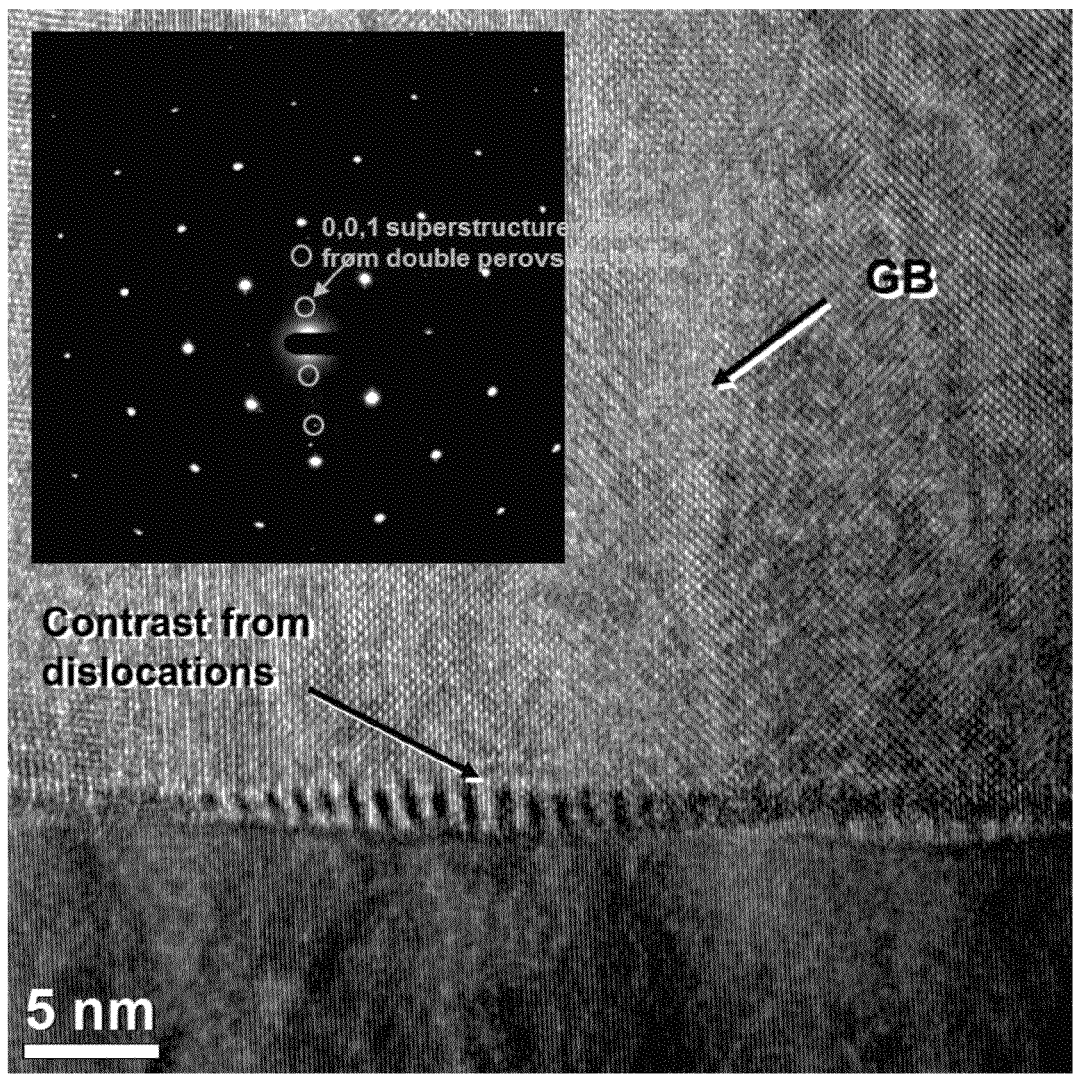
FIG. 6A is a cross-sectional TEM image for the BYNO film grown on the NiW substrate. In the inset of the figure, a selected area diffraction pattern of BYNO phase shows additional spots which correspond to superstructure reflection indicating that BYNO structure is ordered.
Figure 6B:
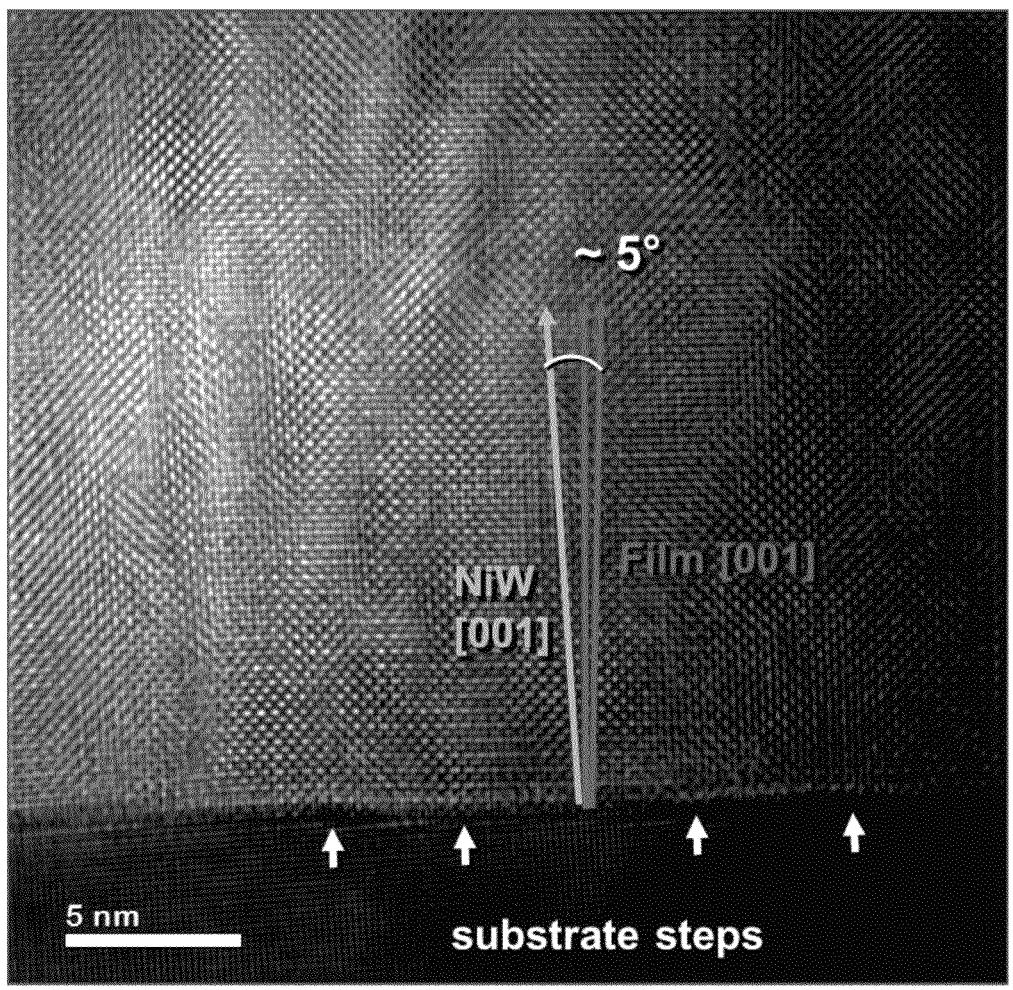
FIG. 6B is a high resolution, cross-sectional TEM image for the BYNO film.

FIG. 6 shows cross-sectional TEM images for the BYNO films. FIG. 6A shows misfit dislocations formed by the large lattice mismatch at the interface area. Formation of misfit dislocations accommodates a large misfit strain and promotes the tilted epitaxy of BYNO film. FIG. 6B is a high resolution TEM image showing a significant tilting of the film toward the surface normal of the film.

Figure 7:
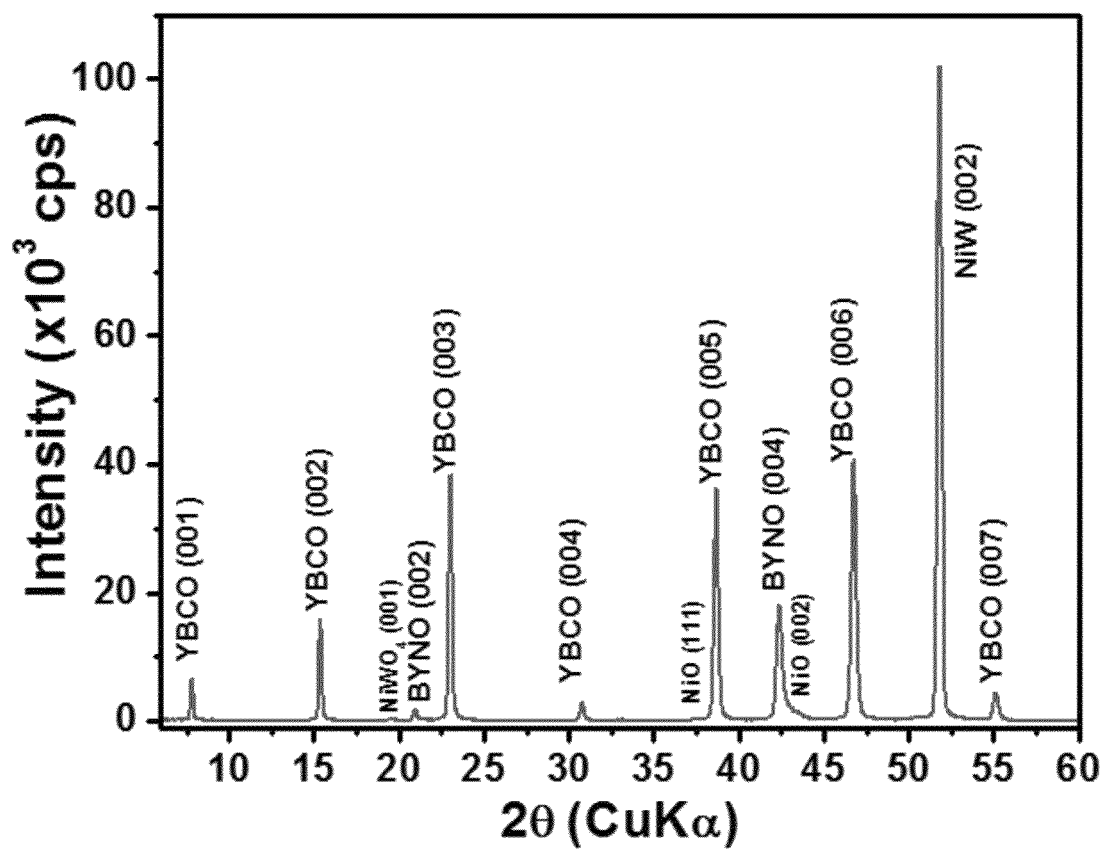
FIG. 7 is a θ-2θ scan for YBCO film grown on Ni-5 at. % W substrate with BYNO single buffer layer.
Figure 8:
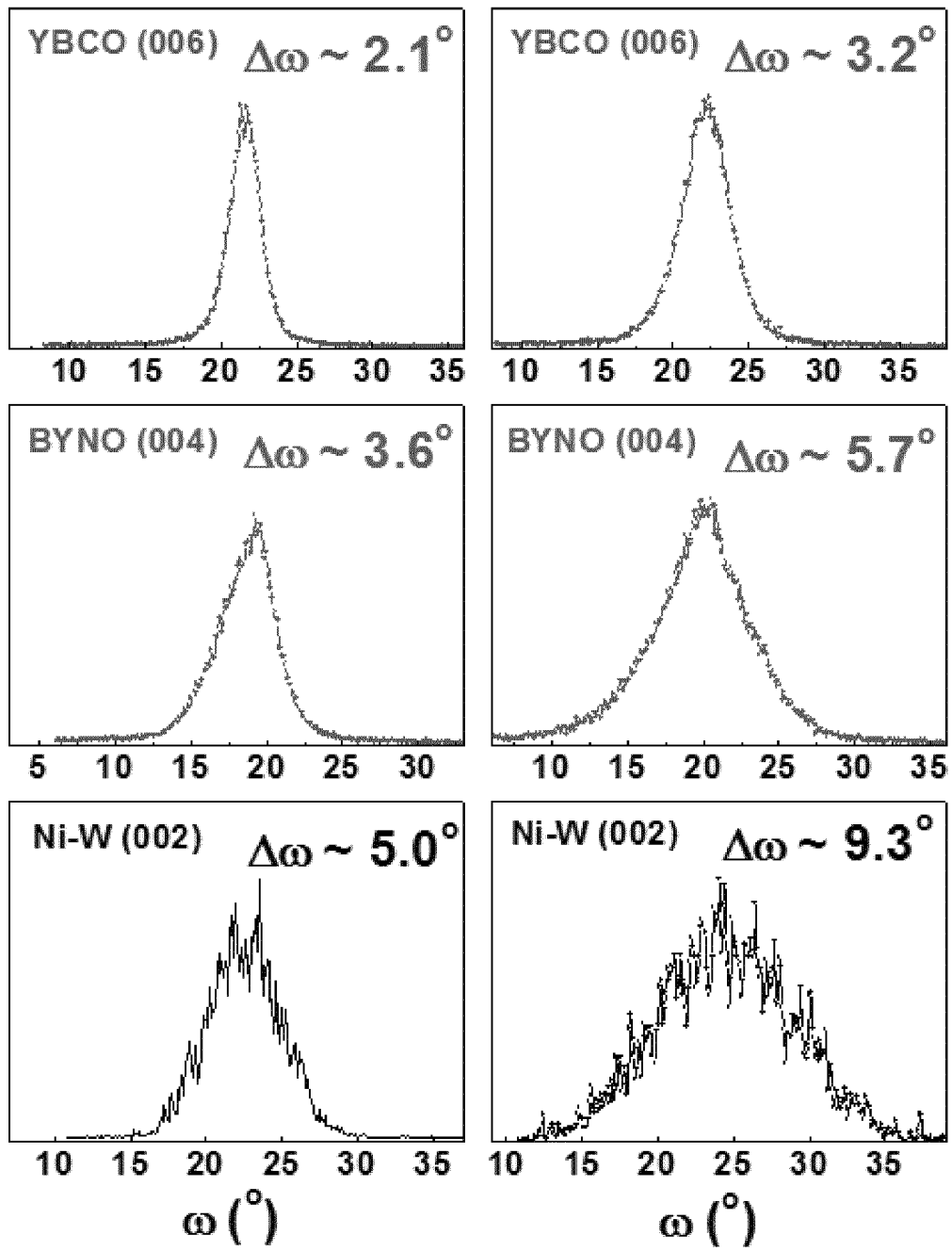
FIG. 8 are ω scans for YBCO layer, BYNO layer and Ni5W substrate for YBCO film grown on BYNO buffered Ni-5W substrate. The left figures are w scans at rolling (φ=0°) direction and the right figures are w scans at transverse (φ=90°) direction.
Figure 9:
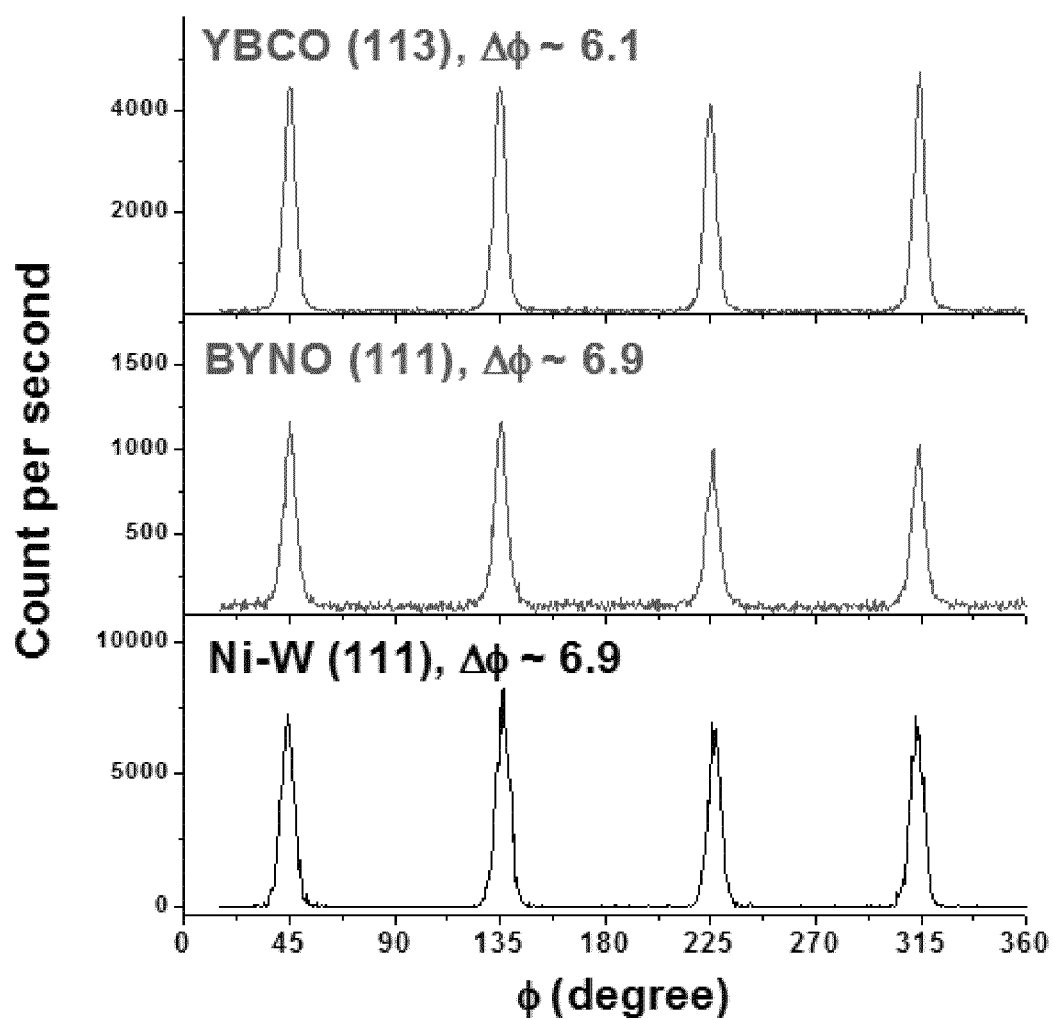
FIG. 9 is a plurality of φ scans for YBCO layer, BYNO layer, and Ni5W substrate for YBCO film grown on BYNO single buffered Ni-5W substrate.

The out-of-plane texture sharpening of the YBCO layer is also expected when the film is epitaxially grown on a BYNO single buffered Ni—W substrate due to a large lattice mismatch (~9.43%) between YBCO and BYNO. YBCO film with the thickness of ~200 nm was grown at $P(O_2)$ of 200 mTorr and $T_s$=760° C. via PLD. FIG. 7 shows a θ-2θ scan for the YBCO film grown on Ni-5 at. % W substrate with a single BYNO buffer layer. The YBCO layer has an excellent cube-on-cube, epitaxial relationship with the BYNO layer and NiW substrate and has strong out-of-plane c-axis orientation. Small peaks related to phases of $NiWO_4$, NiO caused by the self-limited oxidation of the NiW substrate during YBCO film growth can also be seen, in addition to the (00l) oriented YBCO and BYNO peaks. FIGS. 8-9 show omega and phi scans of the YBCO layer, the BYNO layer, and Ni5W substrates taken from the sample. As expected, further significant out-of-plane texture sharpening is observed from the YBCO layer. Compared to the BYNO layer, the YBCO layer has 1.5-2.5° smaller Δω values in both longitudinal) (φ=0°) and transverse (φ=90°) directions. In addition to the out-of-plane texture sharpening, the YBCO film has the improved in-plane texture with smaller Asp value.

A high temperature superconducting material is generally characterized by having a superconducting critical temperature ($T_c$) of at least 35 K, and more preferably, greater than 77 K. Currently, a majority of the HTS materials belong to the general class of copper oxide superconducting materials. HTS materials that are suitable for the invention should be substantially chemically inert with double perovskite layer. In one embodiment, the superconducting layer includes a rare-earth (RE) or transition metal barium copper oxide composition (hereinafter, a "metal-barium-copper-oxide" or "REBCO" composition). The rare earth element can be any of the lanthanide or actinide metals listed in the Periodic Table of the Elements (hereinafter, the "Periodic Table"). The lanthanide metals refer predominantly to the elements of the Periodic Table having an atomic number of 57 to 71. The actinide metals generally refer to any of the elements of the Periodic Table having an atomic number of 90 to 103. In a particular embodiment, the metal-barium-copper-oxide material is according to the formula $(RE)Ba_2Cu_3O_7$, wherein RE is a rare earth or transition metal element. Some examples of suitable RE metals include, yttrium (Y), neodymium (Nd), gadolinium (Gd), thulium (Tm), ytterbium (Yb), lutetium (Lu), and combinations thereof. The transition metals generally refer to any of the elements located in Groups 3-12 of the Periodic Table (i.e., the corresponding scandium through zinc groups). In still another embodiment, the HTS film includes a lanthanum-containing copper oxide material. The lanthanum-containing copper oxide material can include a composition according to the general formula $La_{2-x}M_xCuO_4$, wherein x is greater than zero and less than 2, and M is an alkaline earth metal ion, such as Mg, Ca, Sr, or Ba. Some specific examples of such superconducting materials include $La_{1.85}Ba_{0.15}CuO_4$ (LBCO) and $La_{1.85}Sr_{0.15}CuO_4$ (LSCO).

Other metal barium copper oxide compositions can also be suitable. For example, in one embodiment, the superconducting material is an yttrium barium copper oxide (YBCO) material. Any of the yttrium barium copper oxide superconducting materials known in the art can be used herein. In one instance, the yttrium barium copper oxide material can be generally described by the formula $YBa_2Cu_3O_{7-x}$, wherein x is generally a number within the approximate range $0 \leq x \leq 1$. As used herein, the formula $YBa_2Cu_3O_7$ is ascribed the same meaning, and includes all of the possible different variations, as encompassed by the former broader formula. Some examples of other types of yttrium barium copper oxide materials include $Y_3Ba_4Cu_7O_{16}$, $Y_2Ba_4Cu_7O_{15}$, $Y_2CaBa_4Cu_7O_{16}$, $(Y_{0.5}Lu_{0.5})Ba_2Cu_3O_7$, $(Y_{0.5}Tm_{0.5})Ba_2Cu_3O_7$, and $(Y_{0.5}Gd_{0.5})Ba_2Cu_3O_7$.

In another embodiment, the high temperature superconducting film includes a thallium-containing barium copper oxide composition. More particularly, the composition may be a thallium barium calcium copper oxide material. Any of the thallium barium calcium copper oxide materials can be used herein. In one instance, the thallium barium calcium copper oxide material includes a composition according to the formula $TlBa_2Ca_{n-1}Cu_nO_{2n+3}$, wherein n is generally a number greater than 1 and up to 4. In another instance, the thallium barium calcium copper oxide material includes a composition according to any of the formulas $Tl_2Ba_2Ca_{n-1}Cu_nO_{2n+2}$, $Tl_2Ba_2Ca_{n-1}Cu_nO_{2n+3}$, or $Tl_2Ba_2Ca_{n-1}Cu_nO_{2n+4}$, wherein n is generally a number greater than 1 and up to 4. Some specific examples of such superconducting compositions include $Tl_2Ba_2Ca_2Cu_3O_{10}$ (TBCCO-2223), $Tl_2Ba_2CaCu_2O_6$, $TlBa_2Ca_2Cu_3O_9$, and $TlBa_2Ca_3Cu_4O_{11}$.

In another embodiment, the high temperature superconducting film includes a mercury-containing barium copper oxide material. More particularly, the composition may be a mercury barium calcium copper oxide material. Any of the mercury barium calcium copper oxide materials can be used herein. In a particular embodiment, the mercury barium calcium copper oxide material includes a composition according to the formula $HgBa_2Ca_{n-1}Cu_nO_{2n+2}$, wherein n is a number greater than 1 and up to 4. Some specific examples of such superconducting compositions include $HgBa_2Ca_2Cu_3O_8$, $HgBa_2Ca_2Cu_4O_{10}$, $HgBa_2(Ca_{1-a}Sr_a)Cu_3O_8$ (wherein $0 \leq a \leq 1$), and $(Hg_{0.8}Tl_{0.2})Ba_2Ca_2Cu_3O_{8+x}$.

In yet another embodiment, the high temperature superconducting film includes a bismuth- and/or strontium-containing calcium copper oxide material. More particularly, the composition may be a bismuth strontium calcium copper oxide (BSCCO) material. Any of the BSCCO materials can be used herein. In a particular embodiment, the BSCCO material includes a composition according to the formula $Bi_2Sr_2Ca_nCu_{n-1}O_{2n+6}$. Some specific examples of such superconducting compositions include $Bi_2Sr_2CaCu_2O_8$ (BSCCO-2212) $Bi_2Sr_2Ca_2Cu_3O_{10}$ (BSCCO-2223), $Bi_2Sr_2CaCu_2O_9$, and $Bi_2Sr_2(Ca_{0.8}Y_{0.2})Cu^2O_8$.

Any of the superconducting materials described above can include dopant amounts of other metals that may be included to facilitate certain desired properties of the HTS film. Some examples of rare earth dopants include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof. In a particular embodiment, YBCO film compositions are doped with one or more of the above rare earth metals.

The superconducting film can also be composed of one or more than superconducting layer(s). For example, it may be preferred in certain embodiments to apply a YBCO layer onto a BSCCO layer, or vice-versa.

The superconducting film can be of any suitable thickness. For electrical power applications, the thickness is typically no more than about 5 μm thick, and more typically no more than about 10 μm thick. For example, in different embodiments, the thickness of the superconducting film can be about 5, 4, 3, 2, or 1 μm. However, the thickness is highly dependent on the particular application, and thus, can be of significantly greater thickness (e.g., 10, 15, 20, 25 or more μm), or alternatively, of much lesser thickness (e.g., no more than 1, 0.5, 0.2, or 0.1 μm).

The superconducting films can be formed by many different processes, including in-situ processes and ex-situ processes. In-situ processes include pulsed laser ablation, MOCVD, sputtering or e-beam co-evaporation, chemical vapor deposition (CVD), and metallorganic chemical vapor deposition (MOCVD).

Ex-situ processes include chemical solution processes such as metal organic deposition using trifluoroacetates precursor solution (TFA-MOD), non-fluorine MOD processes, and reduced fluorine MOD processes, and the ex-situ $BaF_2$ process wherein a precursor film is first deposited, followed by a heat treatment to epitaxially form the film.

The superconducting layer can also be coated with any of a variety of materials that can serve a useful purpose. For example, a non-superconducting metal layer may be applied on the superconducting film to protect the film, such as for corrosion resistance. Alternatively, a coating (e.g., metallic, polymeric, plastic, rubber, paint, or hybrid) can be applied onto the superconducting layer to provide, for example, electrical or magnetic insulation, or a certain level of rigidity or flexibility.

The superconducting film can be supported on or deposited on any of several suitable substrates known in the art. The primary substrate considered herein possesses an ordered (i.e., typically, biaxially-textured) surface upon which the phase-separated layer is deposited. For example, any of the biaxially-textured substrates known in the art can be used as the primary substrate on which the phase-separated layer is deposited. As used herein, "supported on" refers to a layer that is above another layer, while "deposited on" refers to a layer that is above and in physical contact with another layer.

The term "biaxially-textured substrate" as used herein is meant to be synonymous with the related term "sharply biaxially-textured substrate." By one definition, a biaxially-textured substrate is a polycrystalline substrate wherein the grains are aligned within a specific angular range with respect to one another, as would generally be found on the surface of a bulk single crystal. A polycrystalline material having biaxial texture of sufficient quality for electromagnetic applications can be generally defined as having an x-ray diffraction phi scan peak of no more than 20° full-width-half-maximum (FWHM) and an omega-scan of 10° FWHM. The X-ray phi-scan and omega-scan measure the degree of in-plane and out-of-plane texture, respectively. An example of biaxial texture is the cube texture with orientation {100}<100>, wherein the (100) crystallographic plane of all grains is parallel to the substrate surface and the [100] crystallographic direction is aligned along the substrate length.

Other suitable definitions can also be used for defining a biaxially-textured substrate. For example, a biaxially-textured substrate can be defined as a substrate having a crystallographic orientation such that the substrate possesses a FWHM within 7°, preferably within 5°, and more preferably within 3° throughout the crystal. Furthermore, the biaxially-textured substrate need not be polycrystalline (i.e., multi-grained), but may be single-crystalline (i.e., single-grained).

Several types of biaxially-textured substrates are known, all of which are suitable for the purposes herein. Among them, a class of primary substrates suitable for use herein is the class of rolling assisted, biaxially-textured substrates (RABiTS). The RABiTS method produces a polycrystalline substrate having primarily low angle grain boundaries. Further details of the RABiTS technique and formed substrates can be found in, for example, A. Goyal, et al., *J. of Materials Research*, vol. 12, pgs. 2924-2940, 1997, and D. Dimos et al., *Phys. Rev. B*, 41:4038-4049, 1990, the disclosures of which are incorporated herein by reference.

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113, the disclosures of which are incorporated herein by reference in their entireties.

In a preferred embodiment, a RABiTS substrate is prepared generally as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys), and more preferably, nickel and its alloys (e.g., NiW). A substrate with a Cu-type rolling texture can be readily identified, as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Another type of biaxially-textured substrate includes the ion-beam-assisted deposition (IBAD) substrate. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties. Typically, an IBAD substrate is characterized by an MgO layer (i.e., "IBAD-MgO") biaxially grown using ion assist on an $Al_2O_3$/$Y_2O_3$-coated polycrystalline nickel-based alloy (generally, Hastelloy) base substrate. The Hastelloy substrate is typically deposited on a polycrystalline copper layer. The $Al_2O_3$ layer serves primarily as a barrier to prevent upward diffusion of substrate components (i.e., functions as a diffusion barrier layer) while the $Y_2O_3$ layer serves as a seed layer for the IBAD-MgO nucleation. Often, a homo-epitaxial MgO (i.e., homo-epi MgO) layer is epitaxially grown on the IBAD-MgO layer to improve the texture of the IBAD-MgO layer. A texture-transferring capping layer according to the invention can be deposited on the homo-epi MgO layer, or directly on the IBAD-MgO layer. The texture-transferring cap layer functions to transfer the texture of the MgO layer to the superconducting layer, i.e., wherein the superconducting layer is generally deposited on the capping layer.

Yet another type of biaxially-textured substrate includes the inclined-substrate deposition (ISD) substrate. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties. In both the IBAD and ISD processes, a biaxially-textured layer is deposited on a flexible, polycrystalline, untextured substrate.

The superconducting articles described herein are particularly applied as improved superconducting tapes or wires. As generally understood in the art, a tape or wire generally refers to an article having a width dimension much smaller than its length dimension. The tape or wire can have a length of, for example, at least 0.1 meters (0.1 m), 0.5 m, 1 m, 5 m, 10 m, 50 m, 100 m, 1 km, or more.

A superconducting tape produced by the method described herein can be used in place of any traditional wiring. In particular embodiments, the superconducting tape is used in, for example, a fault current limiter, power transmission cable, electromagnet coil (i.e., superconducting magnet), motor, turbine, transformer, pump, compressor, communication device (e.g., radiofrequency device), wireless device, engine (e.g., in motor vehicle), power storage device, or electrical generator.

Examples have been set forth for the purpose of illustration and to describe the best mode of the invention at the present time. However, the scope of this invention is not to be in any way limited by the examples set forth herein.

We claim:
1. A superconducting article comprising:
 a substrate having a biaxially textured surface, wherein said biaxially textured substrate is selected from the group consisting of single crystal substrates, RABiTS and IBAD substrates;

an epitaxial, biaxially textured buffer layer directly on the substrate, the buffer layer comprising a double perovskite of the formula $A_2B'B''O_6$, where A is rare earth or alkaline earth metal and B' and B'' are different rare earth or transition metal cations; and, an epitaxial, biaxially textured superconductor layer directly on the buffer layer.

2. The superconducting article of claim 1, wherein the superconducting layer comprises a REBCO material.

3. The superconducting article of claim 2, wherein the REBCO is YBCO.

4. The superconducting article of claim 1, wherein A is at least one selected from the group consisting of Ba, Ca, and Sr.

5. The superconducting article of claim 1, wherein B' is at least one selected from the group consisting of Y and RE.

6. The superconducting article of claim 1, wherein B'' is at least one selected from the group consisting of Nb and Ta.

7. The superconducting article of claim 1, wherein the double perovskite is at least one selected from the group consisting of $Ba_2(Y$ and/or $RE)NbO_6$ and $Ba_2(Y$ and/or $RE)TaO_6$.

8. The superconducting article of claim 1, wherein said buffer layer is a diffusion barrier layer.

9. The superconducting article of claim 1, wherein the superconducting layer is between 1-5 microns thick and the article has a Jc greater than 1 $MA/cm^2$.

10. A superconducting article comprising:

a substrate having a biaxially textured surface, wherein said biaxially textured substrate is selected from the group consisting of single crystal substrates, RABiTS and IBAD substrates;

an epitaxial, biaxially textured buffer layer directly on the substrate, the buffer layer comprising a double perovskite of the formula $A_2B'B''O_6$, where A is rare earth or alkaline earth metal and B' and B'' are different rare earth or transition metal cations; and, an epitaxial, biaxially textured superconductor layer supported by the buffer layer; and, another biaxially textured buffer layer between said double perovskite buffer layer and the superconductor layer that is different from the material comprising the double perovskite buffer layer.

11. The superconducting article of claim 10, wherein the superconductor layer comprises YBCO.

* * * * *